(12) United States Patent
Son

(10) Patent No.: US 8,134,167 B2
(45) Date of Patent: Mar. 13, 2012

(54) LIGHT EMITTING DEVICE AND MANUFACTURING METHOD OF THE SAME

(75) Inventor: Hyo-Kun Son, Daejeon-si (KR)

(73) Assignee: LG Innotek Co., Ltd, Seoul (KR)

( * ) Notice: Subject to any disclaimer, the term of this patent is extended or adjusted under 35 U.S.C. 154(b) by 2 days.

(21) Appl. No.: 10/564,486

(22) PCT Filed: Apr. 12, 2005

(86) PCT No.: PCT/KR2005/001045
§ 371 (c)(1),
(2), (4) Date: Jan. 13, 2006

(87) PCT Pub. No.: WO2005/101534
PCT Pub. Date: Oct. 27, 2005

(65) Prior Publication Data
US 2007/0001191 A1    Jan. 4, 2007

(30) Foreign Application Priority Data

Apr. 13, 2004  (KR) .................... 10-2004-0025310

(51) Int. Cl.
*H01L 33/00* (2010.01)
(52) U.S. Cl. ....... 257/94; 257/77; 257/96; 257/E33.008; 257/E33.023; 257/E33.025
(58) Field of Classification Search ............ 257/13, 257/14, 86, 103, E33.008, E33.023, E33.025
See application file for complete search history.

(56) References Cited

U.S. PATENT DOCUMENTS

| | | | | |
|---|---|---|---|---|
| 5,684,309 A | * | 11/1997 | McIntosh et al. | 257/191 |
| 5,903,017 A | * | 5/1999 | Itaya et al. | 257/190 |
| 6,285,696 B1 | * | 9/2001 | Bour et al. | 372/45.01 |
| 6,337,493 B1 | * | 1/2002 | Tanizawa et al. | 257/79 |
| 6,370,176 B1 | * | 4/2002 | Okumura | 372/45.01 |
| 6,440,823 B1 | * | 8/2002 | Vaudo et al. | 438/478 |
| 6,586,762 B2 | * | 7/2003 | Kozaki | 257/14 |
| 6,614,059 B1 | * | 9/2003 | Tsujimura et al. | 257/101 |
| 6,711,191 B1 | * | 3/2004 | Kozaki et al. | 372/43.01 |
| 7,180,096 B2 | * | 2/2007 | Wu et al. | 257/79 |

(Continued)

FOREIGN PATENT DOCUMENTS

CN    1292934 A    4/2001

(Continued)

OTHER PUBLICATIONS

Youn-Hoon Kim et al., Structural and Optical Porperties of InGaN/GaN Multi-Quantum Well Structures with Different Well Widths, Spring 2003, Materials Research Society Symposium Proc. vol. 722, K7.12.1.*

(Continued)

*Primary Examiner* — Lynne Gurley
*Assistant Examiner* — Jesse Y Miyoshi
(74) *Attorney, Agent, or Firm* — Birch, Stewart, Kolasch & Birch, LLP

(57) ABSTRACT

A light emitting device is provided. In the light emitting device, a multi-layer for intercepting a reverse voltage applied to an active layer is formed between the active layer and a GaN layer. Accordingly, the reliability and operational characteristic of the light emitting device can be improved.

11 Claims, 2 Drawing Sheets

U.S. PATENT DOCUMENTS

| | | |
|---|---|---|
| 7,193,246 B1 * | 3/2007 | Tanizawa et al. .............. 257/94 |
| 2002/0175341 A1 * | 11/2002 | Biwa et al. .................... 257/103 |
| 2002/0195606 A1 * | 12/2002 | Edmond et al. ................. 257/79 |
| 2003/0006418 A1 * | 1/2003 | Emerson et al. ................ 257/79 |
| 2003/0020061 A1 * | 1/2003 | Emerson et al. ................ 257/14 |
| 2003/0205711 A1 * | 11/2003 | Tanizawa et al. ............... 257/79 |
| 2004/0155248 A1 * | 8/2004 | Fukuda et al. .................. 257/79 |

FOREIGN PATENT DOCUMENTS

| | | |
|---|---|---|
| EP | 1 063 711 A1 | 3/1999 |
| EP | 1 267 422 A2 | 6/2002 |
| JP | 9-92880 A | 4/1997 |
| JP | 11220169 * | 8/1999 |
| JP | 11-220169 A | 10/1999 |
| JP | 2001-148507 A | 5/2001 |
| JP | 2001-298215 A | 10/2001 |
| JP | 2003-273473 A | 9/2003 |
| KR | 10 2004 0029165 A | 4/2004 |
| KR | 10-448351 B | 9/2004 |
| WO | WO-99/46822 | 9/1999 |
| WO | WO-99/46822 A1 | 9/1999 |
| WO | WO03005459 * | 1/2003 |
| WO | WO-2005/101534 A1 | 10/2005 |

OTHER PUBLICATIONS

Kenji Uchida, Photoluminescence Characteristics and Pit Formation of InGaN/GaN Quantum-Well Structures Grown on Sapphire Substrates by Low-Pressure Metalorganic Vapor Phase Epitaxy, Mar. 1999, Journal of Electronic Materials.*

Kenji Uchida et al., "Photoluminescence Characteristics and Pit Formation of InGaN/GaN quantum-well structures grown on sapphire substrates by low-pressure metalorganic vapor phase epitaxy", Nov. 17 1998, Journal of Electronic Materials, vol. 28, No. 3, 1999, pp. 246-251.*

Kenji Uchida, et al., "Photoluminescence Characteristics and Pit Formation of InGaN/GaN Quantum-Well Structures Grown on Sapphire Substrates by Low-Pressure Metalorganic Vapor Phase Epitaxy," Journal of Electronic Materials, vol. 26, No. 3, 1999, pp. 246-251.

* cited by examiner

[Fig. 1]
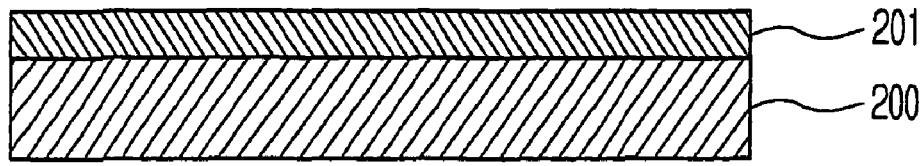
[Fig. 2]
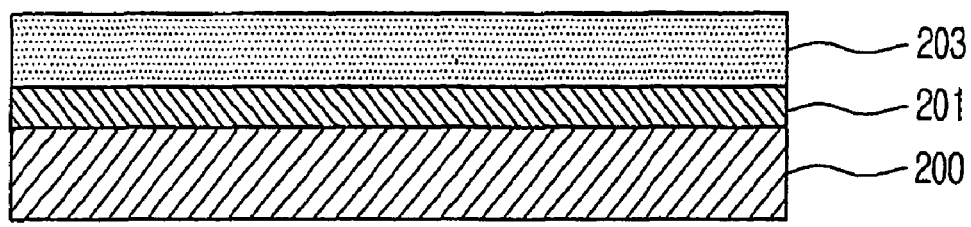
[Fig. 3]
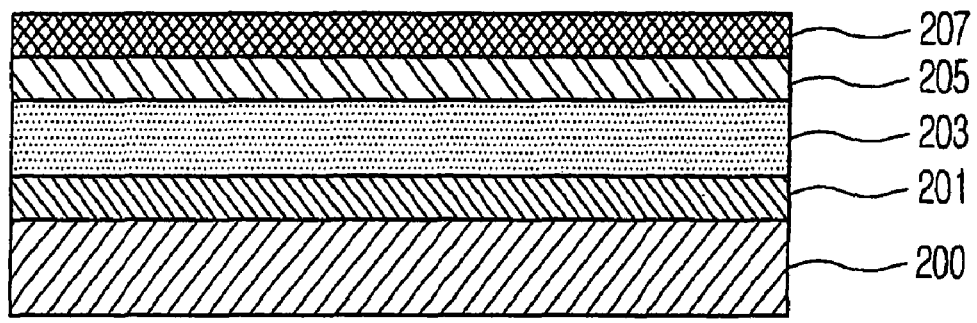
[Fig. 4]
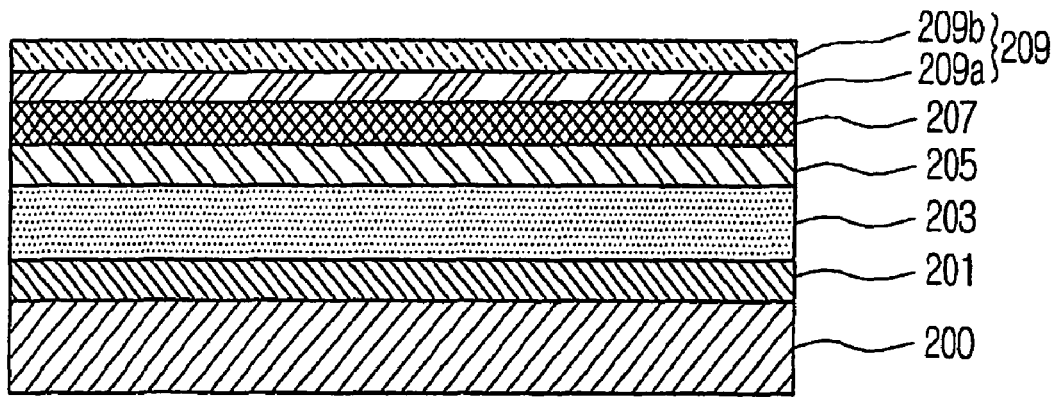

[Fig. 5]
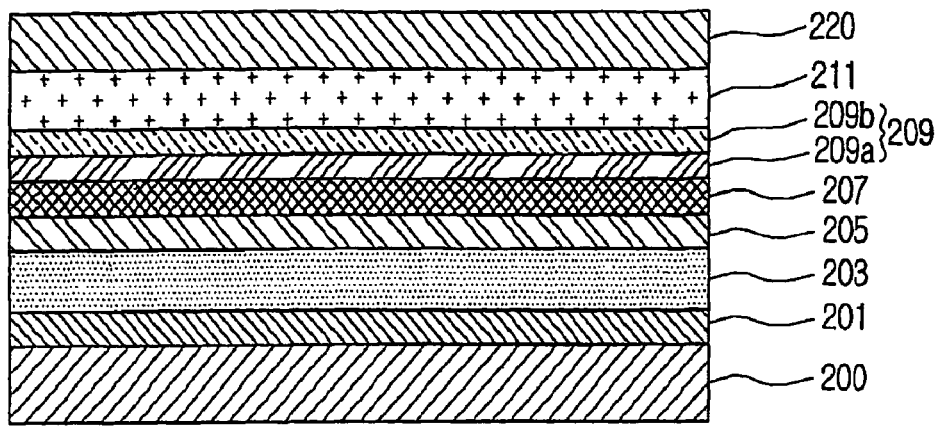
[Fig. 6]
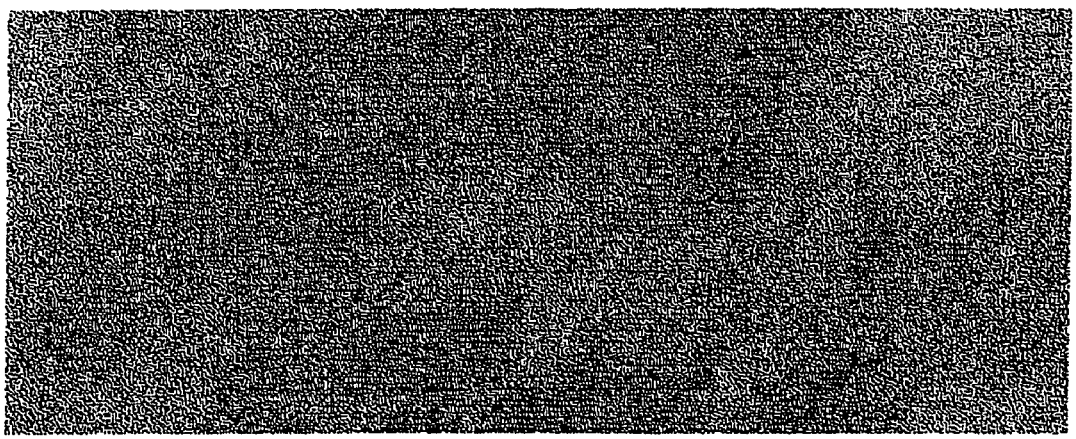
[Fig. 7]
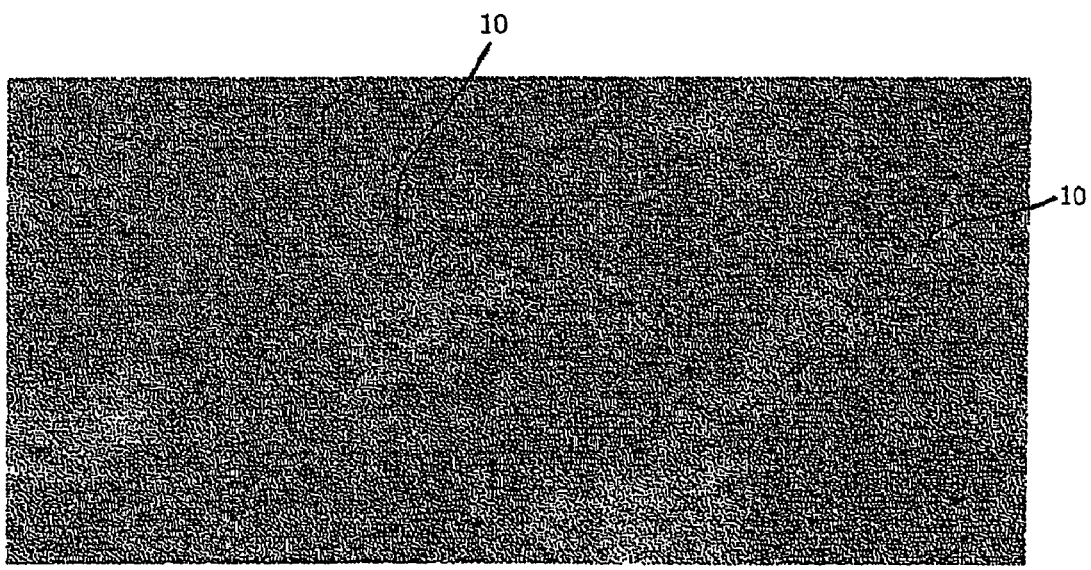

LIGHT EMITTING DEVICE AND MANUFACTURING METHOD OF THE SAME

TECHNICAL FIELD

The present invention relates to a light emitting device, and particularly, to a light emitting device having an improved operational reliability and a manufacturing method of the same. More particularly, the present invention relates to a light emitting device providing an improved operational reliability by a structure in which it is protected from static electricity and its breakdown voltage is increased, and a manufacturing method of the same.

BACKGROUND ART

A light emitting device is a kind of semiconductor device that converts electrical energy into light by using a characteristic of a compound semiconductor. The light emitting device is widely used for home appliances, a remote controller, an electronic display board, a display device, a variety of automation apparatuses, and the like. A typical example of the light emitting device is a light emitting diode (LED).

The LED is operated in such a way that electrons and holes are recombined with each other while moving through a PN-junction by a forward voltage applied to a semiconductor of a specific chemical element, and the fall of an energy level due to the electron-hole recombination causes light emission to occur.

The LED is generally manufactured to have a very small size of 0.25 $mm^2$ and is fixed using a mold. The LED has lead frames for applying a source voltage thereto and is mounted on a printed circuit board (PCB). A typical example of a LED package is a plastic LED package of 5 mm (T 1¾), and a variety of LED packages are being developed in specific application fields. Meanwhile, with the trend of miniaturization and slimness of an information communication device, various components of the device such as a resistor, a condenser and a noise filter are being further miniaturized. In accordance with this trend, the LED is also manufactured in the form of a surface mounted device (SMD) so as to be directly mounted on a PCB.

A color of light emitted from the LED is determined according to its wavelength obtained depending on a combination of elements constituting a semiconductor chip.

Recently, following red and green LEDs a blue LED has been developed, and the LED is being more widely used in various technical fields. For example, the LED is used as a white-light lamp or a light source for a display device. Moreover, the LED is further improved in its light luminance and thus is also used for an electronic display board and a camera of a mobile phone.

A general blue LED is constructed to include a sapphire substrate, a buffer layer formed on the sapphire substrate, an undoped GaN layer formed on the buffer layer, an N-type GaN layer formed on the undoped GaN layer, an active layer formed on the N-type GaN layer, and a P-type GaN layer formed on the active layer.

The active layer is a semiconductor layer made of luminescent material such as InGaN, and serves as a light-emitting region.

The P-type GaN layer is in contrast with the N-type GaN layer. When an external voltage is applied to the LED, electrons move from the N-type GaN layer into the active layer and holes move from the P-type GaN layer into the active layer. The electrons and the holes are then recombined with each other in the active layer to thereby cause light emission.

The abovementioned light emitting device has a drawback in that its reliability is degraded when its light luminance is improved, and vice versa. The light emitting device must have a high reliability so as to be used for a high-luminance electronic display board and a mobile phone. In order to improve the reliability of the light emitting device, each layer formed in the device must be improved in crystallinity. However, the light emitting device has limitations in reliability improvement because it has structural limitations for emitting light of a desired wavelength.

Also, when a high voltage is applied to the light emitting device so as to improve its light luminance, its active layer is frequently damaged by the applied high voltage, causing the further degradation of its reliability.

Furthermore, when an electrostatic discharge (ESD) generated from electronic components near the light emitting device or from a human body is applied to the light emitting device, the light emitting device (specifically, its active layer) is frequently damaged by the applied ESD. To solve this problem caused by the ESD, an additional diode such as a Zener diode may be provided at a power input terminal of the light emitting device. However, this additional diode undesirably causes an increase in the manufacturing cost of the light emitting device.

DISCLOSURE

Technical Problem

Accordingly, the present invention is directed to a light emitting device and a manufacturing method thereof that substantially obviate one or more of the problems due to limitations and disadvantages of the related art.

An object of the present invention is to provide a light emitting device having an improved operational reliability and a manufacturing method thereof.

Another object of the present invention is to provide a light emitting device having an improved light luminance without degradation in its reliability and a manufacturing method thereof.

A further object of the present invention is to provide a light emitting device that can be simply mounted on a desired apparatus because a separate diode need not be provided at its power input terminal and a manufacturing method thereof.

TECHNICAL SOLUTION

To achieve these and other advantages and in accordance with the purpose of the present invention, as embodied and broadly described herein, a light emitting device includes: a substrate; a gallium nitride layer provided above the substrate; an N-type gallium nitride layer provided above the gallium nitride layer; at least one $In_xGa_{1-x}N/In_yGa_{1-y}N$ multi-layer (0<x,y<1) provided above the N-type gallium nitride layer, x being different from y; and a P-type gallium nitride layer provided above the $In_xGa_{1-x}N/In_yGa_{1-y}N$ multi-layer.

In another aspect of the present invention, a light emitting device includes: a first gallium nitride layer; a second gallium nitride layer; an active layer formed between the first gallium nitride layer and the second gallium nitride layer; and a multi-layer formed between the second gallium nitride layer and the active layer to intercept an applied electrostatic discharge.

In a further aspect of the present invention, a method for manufacturing a light emitting device includes the steps of: forming a buffer layer above a substrate; forming an N-type gallium nitride layer above the buffer layer; forming a multi-layer above the N-type gallium nitride layer, the multi-layer including layers of different growth temperatures; forming an active layer above the multi-layer; and forming a P-type gallium nitride layer above the active layer.

ADVANTAGEOUS EFFECTS

The present invention makes it possible to improve the breakdown voltage characteristic and reliability of a light emitting device.

Also, the present invention makes it possible to protect a light emitting device (specifically, its active layer) from an electrostatic discharge and a high voltage applied thereto.

Furthermore, the present invention makes it possible to improve the operational reliability of a light emitting device without degradation in the light efficiency thereof.

Moreover, the present invention makes it possible to reduce the manufacturing cost and volume of a light emitting device package because a separate diode for intercepting an applied ESD need not be provided at a power input terminal of the light emitting device.

DESCRIPTION OF DRAWINGS

FIGS. 1 to 4 are sectional views illustrating a method for manufacturing a light emitting device according to an embodiment of the present invention.

FIG. 5 is a sectional view of a light emitting device according to an embodiment of the present invention.

FIG. 6 is an AFM image of a related art N-type GaN layer.

FIG. 7 is an AFM image of a multi-layer according to the present invention.

BEST MODE FOR CARRYING OUT THE INVENTION

Reference will now be made in detail to the preferred embodiments of the present invention, examples of which are illustrated in the accompanying drawings.

FIGS. 1 to 4 are sectional views illustrating a method for manufacturing a light emitting device according to an embodiment of the present invention, and FIG. 5 is a sectional view of a light emitting device according to an embodiment of the present invention.

The inventive manufacturing method for the light emitting device will now be described with reference to FIGS. 1 to 5.

Referring first to FIGS. 1 and 2, a GaN buffer layer 201 is formed on a sapphire substrate 200 at a predetermined temperature and then a slow-growth GaN layer 203 is formed on the buffer layer 201. Here, the buffer layer 201 may be grown at 500~600° C.

The GaN layer 203 is formed to prevent the defects of the buffer layer 201 from being transmitted to an undoped GaN layer (see 205 of FIG. 3) that is to be formed on the GaN layer 203 and to a nitride layer near the undoped GaN layer 205.

Referring to FIG. 3, the undoped GaN 205 is grown on the GaN layer 203 at a predetermined temperature and then a doped N-type GaN layer 207 is formed on the undoped GaN layer 205. Here, the undoped GaN layer 205 may be grown at 1000~1100° C.

Referring to FIG. 4, an InGaN/InGaN multi-layer 209 for protecting the light emitting device from an ESD to thereby improve the operational reliability of the device is formed on the doped N-type GaN layer 207 prior to forming an active layer (see 211 of FIG. 5).

The InGaN/InGaN multi-layer 209 is constructed to include a first InGaN layer 209a formed on the doped N-type GaN layer 207 at a high temperature, and a second InGaN layer 209b formed on the first InGaN layer 209a at a low temperature. The first InGaN layer 209a may be grown to a thickness of 1~3000 Å at about 900° C., and the second InGaN layer 209b may be grown to a thickness of 1~3000 at about 800° C. Here, it should be apparent to those skilled in the art that the first and second InGaN layers 209a and 209b each may be grown in plurality. Also, the second InGaN layer 209b may be first formed on the doped N-type GaN layer 207 and then the first InGaN layer 209a may be formed on the second InGaN layer 209b.

In addition, the InGaN/InGaN multi-layer 209 may be formed to have a super lattice structure.

A method for forming the InGaN/InGaN multi-layer 209 will now be described in detail.

The InGaN/InGaN multi-layer 209 is grown using an alkyl source including TMGa and TMIn and a hydride gas including $NH_3$ and $N_2$. Here, TMGa is 50~500 μmol, TMIn is 25~500 μmol, $NH_3$ and $N_2$ are 1~100 liter.

Also, the InGaN/InGaN multi-layer 209 is grown with $H_2$ being removed. Accordingly, $H_2$ is not included in the InGaN/InGaN multi-layer 209.

The first and second InGaN layers 209a and 209b have different In—Ga ratios because they are grown at different temperatures. A layer contains less In when it is grown at a higher temperature. Accordingly, the first InGaN layer 209a contains less In than the second InGaN layer 209b.

In content of the layers 209a and 209b can be expressed as Equation (1) below.

$$\text{In/InGa in } 1^{st} \text{ InGaN layer} \leq 2\%;$$

$$\text{In/InGa in } 2^{nd} \text{ InGaN layer} \leq 3\%; \text{ and} \quad (1)$$

$$\text{In/InGa in } 1^{st} \text{ InGaN layer} \leq \text{In/InGa in } 2^{nd} \text{ InGaN layer}$$

As seen from Equation (1), the second InGaN layer 209b grown at a lower temperature has more In content while the first InGaN layer 209b grown at a higher temperature has less In content.

The InGaN/InGaN multi-layer 209 has a plurality of hexagonal pits (see 10 of FIG. 7) formed thereon due to dislocation and defects resulting from the doped N-type GaN layer 207 and defects resulting from the super lattice structure.

The number of the hexagonal pits 10 is preferably 50 or less per area of 5 μm×5 μm.

The hexagonal pits 10 primarily reduce a current when a reverse voltage is applied to the light emitting device, and thus protects the active layer 211 from a high voltage applied thereto. Also, the hexagonal pits 10 can provide a bypath through which a current flows, thereby preventing the current from flowing through the active layer 211.

The hexagonal pits 10 serves as a kind of capacitor. That is, the capacitor (the hexagonal pits 10) is charged with a forward voltage when a forward voltage is applied to the light emitting device, and is charged with a reverse voltage when a reverse voltage due to an ESD is instantaneously applied thereto. Accordingly, a high ESD can be prevented from being applied to the active layer 211. Consequently, the light emitting device can be protected from an externally-applied high voltage.

Referring to FIG. 5, the active layer 211 having an InGaN/InGaN structure of a multi-quantum well structure is grown on the InGaN/InGaN multi-layer 209. The active layer may be grown at about 600~800° C. Finally, a P-type GaN layer 220 doped with impurities of Mg is grown on the active layer 211.

FIG. 6 is an AFM image of a related art N-type GaN layer, and FIG. 7 is an AFM image of a multi-layer according to the present invention.

Referring to FIGS. 6 and 7, while no pit is formed on a related art N-type GaN layer, a plurality of hexagonal pits 10 are formed on the InGaN/InGaN multi-layer 209.

The hexagonal pits 10 serve to remove a reverse current applied to the light emitting device or to provide a bypath through which a current flows, thereby preventing the active layer 211 being damaged by an externally-applied ESD. Consequently, the light emitting device can be protected from an externally-applied high voltage.

Table 1 below compares an anti-ESD durability of the inventive light emitting device with that of the related art light emitting device.

TABLE 1

| Sample | Related art Light emitting device (volt) | Inventive light emitting device (volt) |
|---|---|---|
| 1 | −100 | −2500 |
| 2 | −100 | −3000 |
| 3 | −400 | −4000 |
| 4 | −300 | −5000 |
| 5 | −200 | −5000 |

It can be seen from Table 1 that the inventive light emitting device equipped with the InGaN/InGaN multi-layer 209 can normally operate even when an about-20-time higher reverse voltage is applied thereto.

As described above, the present invention increases a breakdown voltage of the light emitting device and thus prevents an externally-applied ESD from affecting the light emitting device. Also, the present invention can provide a high breakdown voltage of the light emitting device by merely forming the InGaN/InGaN multi-layer 209 in the device.

Moreover, the photoluminescence characteristic of the InGaN/InGaN multi-layer 209 is maintained at a yellow band intensity/N-doped GaN intensity ratio of 0.4 or below, whereby the operational reliability of the light emitting device can be further improved.

Mode For Invention

While the present invention has been described and illustrated herein with reference to the preferred embodiments thereof, it will be apparent to those skilled in the art that various modifications and variations can be made therein without departing from the spirit and scope of the invention. For example, the inventive InGaN/InGaN multi-layer 209 may be used for a laser diode as well as a light emitting diode. Thus, it is intended that the present invention covers the modifications and variations of this invention that come within the scope of the appended claims and their equivalents.

Industrial Applicability

The present invention can improve an anti-ESD durability of a light emitting device while maintaining the light efficiency of the device.

Also, the present invention can improve the operational reliability of a light emitting device while maintaining the light efficiency of the device. Furthermore, the inventive light emitting device can stably operate even when a high voltage is applied thereto so as to increase its light luminance.

Moreover, the present invention can reduce the manufacturing cost of a light emitting device package because a separate diode for intercepting an applied ESD need not be provided at a power input terminal of the light emitting device.

The invention claimed is:

1. A method for manufacturing a light emitting device, the method comprising the steps of:
    forming a buffer layer;
    forming an N-type gallium nitride layer on the buffer layer;
    forming a super lattice structure including InGaN on the N-type gallium nitride layer,
    wherein the super lattice structure is not doped with an n-type impurity,
    wherein the super lattice structure including InGaN includes a plurality of first InGaN layers and a plurality of second InGaN layers,
    wherein each of the plurality of first InGaN layers has an In composition less than an In composition of each of the plurality of second InGaN layers, and
    wherein the first InGaN layer is directly on the N-type gallium nitride layer;
    forming an active layer on the super lattice structure and including an InGaN/InGaN structure of a multi-quantum well structure,
    wherein the active layer is directly on one of the plurality of second InGaN layers; and
    forming a P-type gallium nitride layer on the active layer,
    wherein the super lattice structure including InGaN has a plurality of pits formed thereon and wherein a non-zero number of the plurality of pits is 50 or less per area of 5 µm×5 µm, and
    wherein the buffer layer is grown at a first temperature,
    wherein the first InGaN layer of the super lattice structure including InGaN is grown at a second temperature higher than the first temperature,
    wherein the second InGaN layer of the super lattice structure including InGaN is grown at a third temperature higher than the first temperature and lower than the second temperature, and
    wherein the active layer is grown at a fourth temperature of 600~800° C. and the fourth temperature is lower than the second temperature and the third temperature.

2. The method according to claim 1, wherein the super lattice structure including InGaN includes an $In_xGa_{1-x}N/In_yGa_{1-y}N$ multi-layer.

3. The method according to claim 1, wherein each layer of the super lattice structure including InGaN has a thickness of 1~3000 Å.

4. The method according to claim 1, wherein the super lattice structure including InGaN has a photoluminescence characteristic of a yellow band intensity/N-doped GaN intensity ratio of 0.4 or below.

5. The method according to claim 1, further comprising:
    forming an undoped GaN layer on the buffer layer before forming the N-type gallium nitride layer.

6. The method according to claim 5, wherein the undoped GaN layer is grown at a fifth temperature higher than the first temperature, the second temperature, the third temperature and the fourth temperature.

7. The method according to claim 1, further comprising:
    forming a plurality of pits between the active layer and the P-type gallium nitride layer.

8. The method according to claim 1, wherein the step of forming a super lattice structure comprises:
    forming the super lattice structure using an alkyl source including TMGa and TMIn and a hydride gas including $NH_3$ and $N_2$.

9. A light emitting diode (LED), comprising:
    a substrate;
    a buffer layer on the substrate;
    an undoped GaN layer on the buffer layer;

a GaN layer between the buffer layer and the undoped GaN layer;

an N-type GaN layer directly on the undoped GaN layer;

a super lattice structure including InGaN directly on the N-type GaN layer, wherein the super lattice structure is not doped with an n-type impurity, wherein the super lattice structure including InGaN includes a plurality of first layers and a plurality of second layers, wherein each of the plurality of first layers has an In composition less than an In composition of each of the plurality of second layers, wherein the first layer is directly on the N-type GaN layer, wherein each of the first layers has a thickness of 1~3000 Å, and wherein each of the second layers has a thickness of 1~3000 Å;

an active layer on the super lattice structure including an InGaN/InGaN structure of a multi-quantum well structure, wherein the active layer is directly on the second layer; and a P-type GaN layer on the active layer, wherein the super lattice structure including InGaN has a plurality of pits thereon and wherein a non-zero number of the plurality of pits is 50 or less per area of 5 μm ×5 μm.

10. The LED according to claim 9, wherein the undoped GaN layer is directly on the GaN layer.

11. The LED according to claim 9, wherein the super lattice structure is formed using an alkyl source including TMGa and TMIn and a hydride gas including $NH_3$ and $N_2$.

* * * * *